(12) United States Patent
Bulucea

(10) Patent No.: US 7,539,023 B2
(45) Date of Patent: May 26, 2009

(54) MONOLITHIC PLUG-IN POWER SUPPLY

(76) Inventor: Andrei Bulucea, 4031 Clipper St., Fremont, CA (US) 94538

( * ) Notice: Subject to any disclaimer, the term of this patent is extended or adjusted under 35 U.S.C. 154(b) by 395 days.

(21) Appl. No.: 11/304,650

(22) Filed: Dec. 15, 2005

(65) Prior Publication Data
US 2007/0141883 A1 Jun. 21, 2007

(51) Int. Cl.
H05K 12/16 (2006.01)
(52) U.S. Cl. .................. 361/785; 361/796; 439/76.1; 439/66; 439/61
(58) Field of Classification Search .......... 361/785, 361/796; 439/76.1, 66, 61
See application file for complete search history.

(56) References Cited

U.S. PATENT DOCUMENTS

| | | | |
|---|---|---|---|
| 3,831,172 A * | 8/1974 | Olliges et al. | 340/384.7 |
| 4,625,259 A | 11/1986 | Krechmer et al. | 361/610 |
| 4,731,703 A | 3/1988 | Tsukaguchi et al. | 361/391 |
| 5,291,009 A * | 3/1994 | Roustaei | 235/462.42 |
| 5,949,652 A | 9/1999 | McAnally et al. | 361/726 |
| 6,160,485 A * | 12/2000 | Krakovich | 340/635 |
| 6,262,831 B1 * | 7/2001 | Bauer et al. | 359/265 |
| 6,377,471 B1 * | 4/2002 | Chong et al. | 361/796 |
| 6,425,027 B1 | 7/2002 | Mills et al. | |
| 6,693,806 B2 | 2/2004 | Uchida | 363/50 |
| 6,731,515 B2 * | 5/2004 | Rhoads | 361/796 |
| 6,827,589 B2 | 12/2004 | Lin et al. | 439/76.1 |
| 7,200,004 B2 | 4/2007 | Chen et al. | 361/686 |
| 2003/0058668 A1 | 3/2003 | Uchida | 363/59 |
| 2004/0064273 A1 * | 4/2004 | Le et al. | 702/60 |
| 2006/0087824 A1 * | 4/2006 | Sandy et al. | 361/796 |

OTHER PUBLICATIONS

"VRM 9.0 DC-DC Converter Design Guidelines," published by Intel Corporation, Santa Clara, CA, Jul. 18, 2001, at http://developer.intel.com/design/pentium4/guides/249205.htm.
"ATX12V Power Supply Design Guide, Version 2.2," published by Intel Corporation, Santa Clara, CA, Mar. 2005, at http://www.formfactors.org/developer%5Cspecs%5CATX12V_PSDG_2_2_public_br2.pdf.
"Regulator Topologies for Battery Powered Systems," published by Maxim Integrated Products and Dallas Semiconductor, Sunnyvale, CA, Nov. 1, 2002, at http://www.maxim-ic.com/appnotes.cfm/appnote_number/660.

(Continued)

*Primary Examiner*—Dean A. Reichard
*Assistant Examiner*—Andargie M Aychillhum

(57) ABSTRACT

A power supply is described. The power supply includes a main power connector and one or more circuit boards rigidly connected to the main power connector, including mechanical and electrical connection. The main power connector has a body that includes a plurality of contacts. The main power connector is configured to mate with a corresponding connector on a motherboard in a computer. The motherboard is coupled to one or more processors. A first plane including a first circuit board in the one or more circuit boards is substantially parallel to a symmetry plane of the body. The symmetry plane includes a direction of insertion of the main power connector when mated with the corresponding connector. The one or more circuit boards include one or more switched mode power supplies to convert an input signal to one or more output signals.

19 Claims, 9 Drawing Sheets

OTHER PUBLICATIONS

"Delphi Series S48SR, 15W 2"×1" Family DC/DC Power Modules: 48V In, 4.5 V Out," published by Delta Electronics, Inc., Fremont, CA, Jan. 12, 2005, at http://www.delta.com.tw/product/ps/dcdc/std/download/data_brief/DB_S48SR_02062004.pdf.

"PW-200M, 200 W, 12V input DC-DC Power Supply," published by Mini-Box.com, at http://www.mini-box.com/PW-200M-DC-DC-power-supply?category=13, Oct. 20, 2006.

* cited by examiner

MONOLITHIC PLUG-IN POWER SUPPLY

BACKGROUND

1. Field of the Invention

The present invention relates to electronic circuits. More specifically, the present invention relates to a monolithic power supply.

2. Related Art

A wide variety of devices utilize electrical power. Such devices often include one or more power supplies to regulate and/or convert an input electrical power signal, such as that provided by a 60 Hz AC power line, into one or more output electrical power signals. These output electrical power signals may be used to power electrical circuits in these devices.

While power supplies are widely used, they do pose some design challenges. In particular, many power supplies include bulky components, such as transformers, that make integration with other components more difficult. This is unfortunate, since integration allows the cost of manufacturing, as well as the size and/or weight of the devices to be reduced.

Some existing computers provide an illustration of these challenges. In computers, a separate power supply is often coupled to the motherboard using a cable harness and a multi-pin connector, such as an ATX connector. Mechanical interference associated with the multi-pin connector also poses constraints on the motherboard size and layout. In particular, to allow mechanical access to the multi-pin connector there is often a de-forested region surrounding it on the motherboard. These limits on integration increase the overall footprint and cost of computers, such as personal computers, in both the standard and tower configurations.

What is needed, therefore, are compact power supplies to overcome the problems listed above.

SUMMARY

Power supplies and systems that include power supplies that overcome the previously described challenges are described. In one embodiment, a power supply includes a main power connector and one or more circuit boards rigidly connected to the main power connector, including mechanical and electrical connection. The main power connector has a body that includes a plurality of contacts. The main power connector is configured to mate with a corresponding connector on a motherboard in a computer. The motherboard is coupled to one or more processors. A first plane including a first circuit board in the one or more circuit boards is substantially parallel to a symmetry plane of the body. The symmetry plane includes a direction of insertion of the main power connector when mated with the corresponding connector. The one or more circuit boards include one or more switched mode power supplies to convert an input signal to one or more output signals.

The power supply may include an interconnect coupled to at least one of the one or more circuit boards. The interconnect may include a plurality or wires coupled to one or more additional connectors. The interconnect may be configured to couple the power supply to one or more peripheral devices.

The one or more circuit boards may include the first circuit board and a second circuit board. A second plane including the second circuit board may be approximately parallel to the first plane.

The plurality of contacts may include a first set of contacts arranged in a first row and a second set of contacts arranged in a second row. The first row may be approximately parallel to the second row. The first circuit board may be rigidly connected to the first set of contacts and the second circuit board may be rigidly connected to the second set of contacts.

In some embodiments, the main power connector is an ATX connector. In some embodiments, each of the one or more switched mode power supplies may be a DC-to-DC converter. The one or more output signals may each be approximately regulated voltages. The power supply may be configured to select respective voltages of the one or more output signals from a pre-determined set of voltages.

In some embodiments, the power supply has a height less than a first pre-determined value and/or a width less than a second pre-determined value.

In some embodiments, the power supply generates at least 3 dB less electromagnetic interference in a band of frequencies than a power supply that has one circuit board.

In another embodiment, a system includes the motherboard in the computer. The motherboard includes a first main power connector. A power supply includes a second main power connector that is mated into the first main power connector and one or more circuit boards rigidly connected to the second main power connector, including mechanical and electrical connection. The second main power connector has the body that includes the plurality of contacts. The first plane including the first circuit board in the one or more circuit boards is substantially parallel to the symmetry plane of the body. The symmetry plane includes the direction of insertion of the second main power connector when mated with the first main power connector. The one or more circuit boards include one or more switched mode power supplies to convert an input signal to one or more output signals. The one or more output signals provide power to the motherboard.

BRIEF DESCRIPTION OF THE FIGURES

Like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a monolithic power supply and systems that utilize the monolithic power supply are described. The monolithic power supply includes a multi-pin connector and one or more circuit boards rigidly connected to the multi-pin connector. The one or more circuit boards are approximately parallel to a plane including a direction of insertion of the multi-pin connector into a corresponding connector.

In an exemplary embodiment, a mother board in a computer includes the corresponding connector. Computers should be understood to include notebook computers, personal computers, work stations, main frames, and other types of computers. The motherboard may include a printed circuit board that is coupled to one or more processors. When connected to the corresponding connector, the power supply has an orientation that is approximately perpendicular to a plane of the motherboard. In the discussion that follows this orientation is referred to as a vertical orientation.

The monolithic power supply may allow at least partial integration of one or more power supplies with the motherboard. Components in the monolithic power supply may be coupled together to form a single, integral structure. Expensive and difficult to assemble components, such as cable harnesses may be simplified or eliminated. The monolithic power supply may have a reduced width and/or height with respect to existing power supplies. The monolithic power supply may have improved thermal and/or electromagnetic interference performance with respect to existing power supplies. These features of the monolithic power supply may enable increased integration, a reduction in size, a reduction in weight and/or a reduction in the cost of devices, such as computers.

Figure 1:
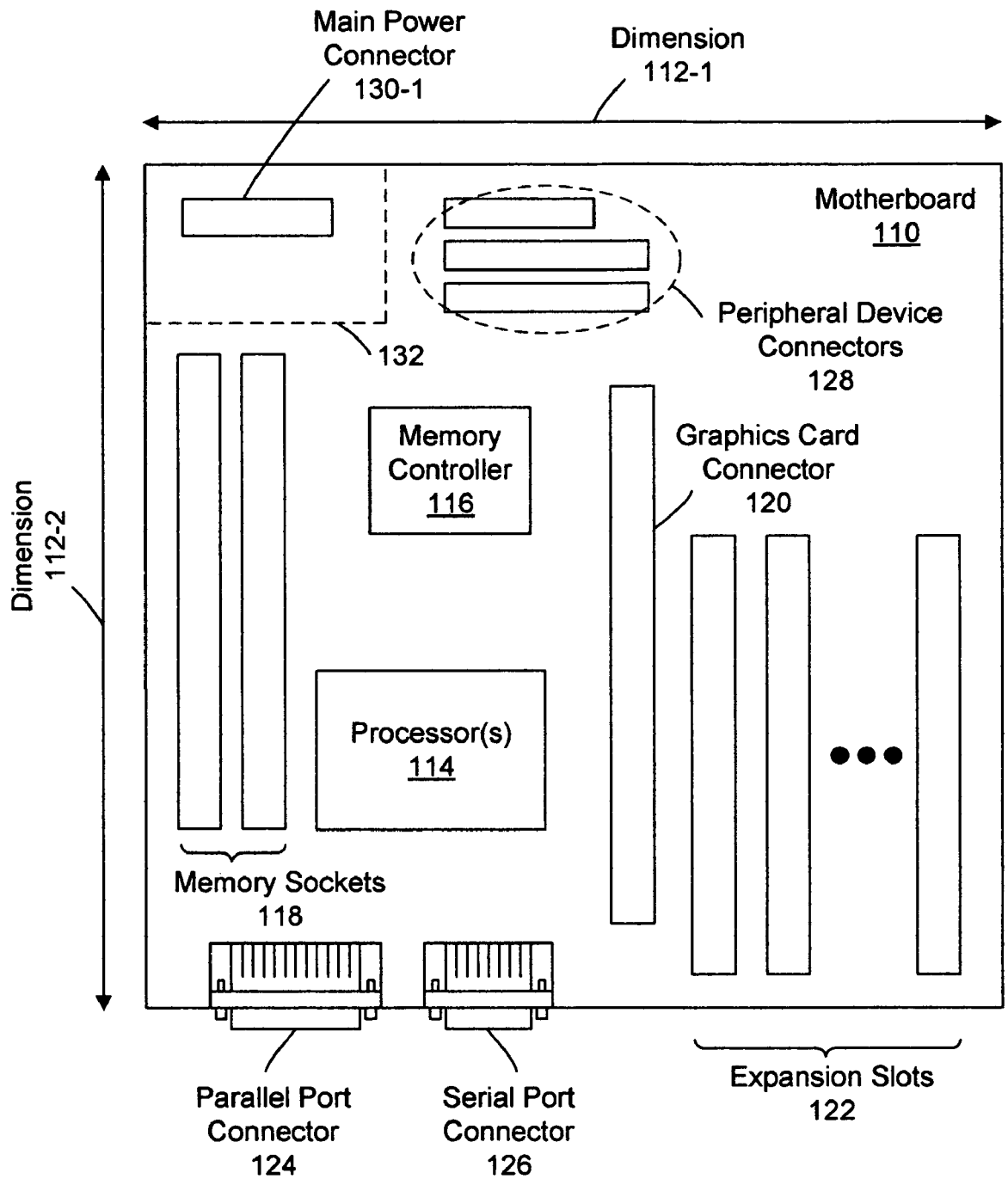
FIG. 1 is a block diagram illustrating an existing motherboard.

Attention is now directed towards existing motherboards and the challenges posed by integrating power supplies. FIG. 1 is a block diagram illustrating an existing motherboard 110. The motherboard 110 has a horizontal dimension 112-1 and a vertical dimension 112-2. The motherboard 110 may include one or more processors 114, such as one or more microprocessors, and a memory controller 116. Solid state memory, such as DRAM, may be coupled to the motherboard 110 using memory sockets 118. A video-graphics card may be coupled to the motherboard 110 using a graphics card connector 120. Additional circuit boards may be coupled to the motherboard 110 using one or more of the expansion slots 122. The expansion slots 122 may include one or more PCI ports.

The motherboard 110 may also include one or more parallel port connectors 124 and/or one or more serial port connectors 126. Peripheral devices, such as one or more disk drives, one or more floppy drives and/or one or more optical drives, may be coupled to the motherboard 110 using one or more of the peripheral device connectors 128.

The motherboard 110 may be coupled to a separate power supply using a multi-pin main power connector 130-1. The main power connector 130-1 may receive the core or regulated voltages that are used to power the components on the motherboard 110. The main power connector 130-1 may be a male connector, which is also referred to as a header. In existing computers, a corresponding main power connector (i.e., one that is configured to mate with the main power connector 130-1) and a cable harness are used to couple the motherboard 110 to the separate power supply. The corresponding main power connector connected to the cable harness may be a female connector, which is also referred to as a receptacle.

To reduce or eliminate mechanical interference when coupling or de-coupling the corresponding main power connector and cable harness to or from the main power connector 130-1, the motherboard 110 may include a region 132 surrounding the main power connector 130-1 that does not contain components. This region 132 is sometimes referred to as a deforested region on the motherboard 110. The region 132 helps contribute to the overall footprint or size of the motherboard 110. Existing motherboards, such as the motherboard 110, typically have dimensions 112 of 300×250 mm². The minimum dimensions 112 are currently limited to 170×170 mm².

Figure 2:
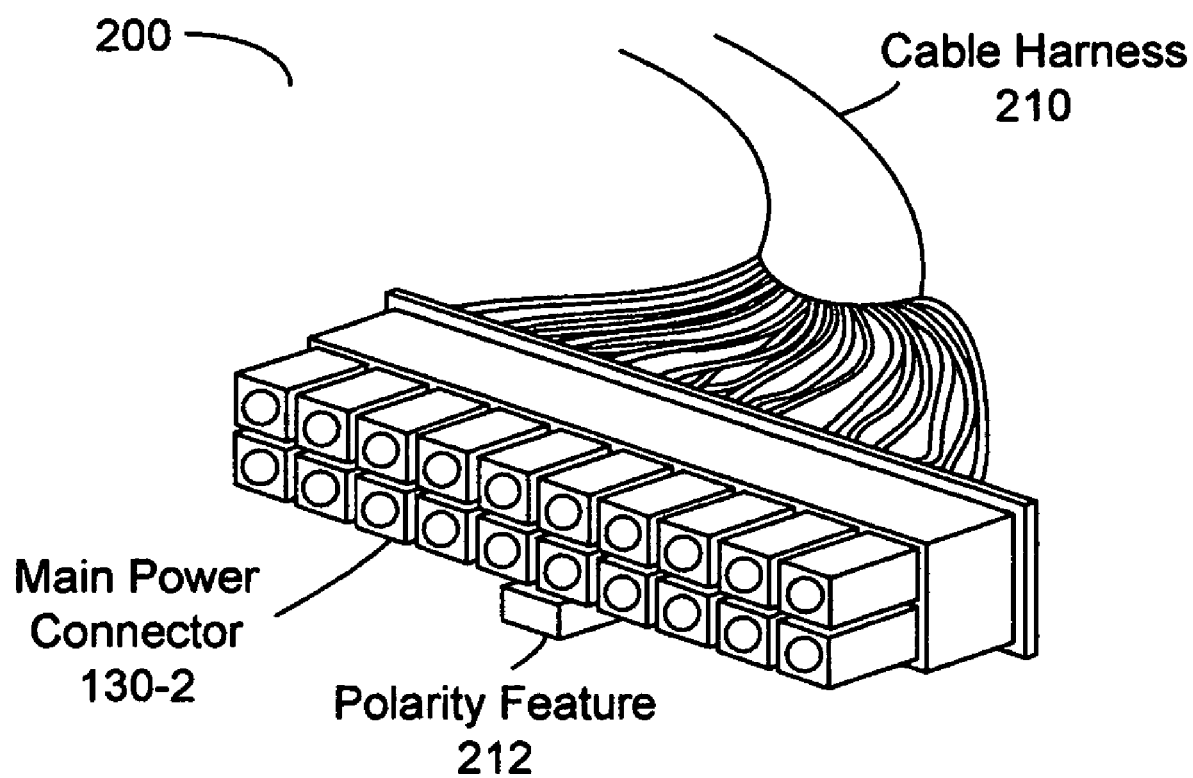
FIG. 2 is a block diagram illustrating an existing main power connector.

For embodiments where the motherboard 110 is in a personal computers, the main power connector 130-1 may be an ATX-compatible connector, i.e., a connector that compiles with an ATX power supply standard, such as the ATX12V Power Supply Design Guide (Intel Corporation, March 2005), the contents of which are hereby incorporated by reference. FIG. 2 is a block diagram illustrating an existing ATX-compatible main power connector 130-2 that is configured to mate into the main power connector 130-1 (FIG. 1), i.e., the main power connector 130-2 is the corresponding main power connector described above. Henceforth, such connectors are referred to as ATX connectors. The main power connector 130-2 is coupled to a cable harness 210. The main power connector 130-2 includes 20 electrical contacts arranged in two approximately parallel rows and a polarity feature or mechanical stop 212 that ensures a correct mechanical orientation when the main power connector 130-2 is connected to the main power connector 130-1 (FIG. 1). When the main power connector 130-2 is connected to the main power connector 130-1 (FIG. 1) the separate power supply is coupled to the motherboard 110 (FIG. 1).

Attention is now directed towards embodiments of monolithic power supplies. One approach to addressing at least some of the integration challenges posed by power supplies is to separate the AC and DC sub-modules contained in the separate power supply, such as an SFX power supply that is used in some computers. In computers, this approach may allow the multi-pin cable harness 210 to be eliminated and may allow at least the DC sub-module from the separate power supply to be directly connected to the motherboard 110 (FIG. 1) and, thereby, to reduce the size of the final assembly.

Figure 3A:
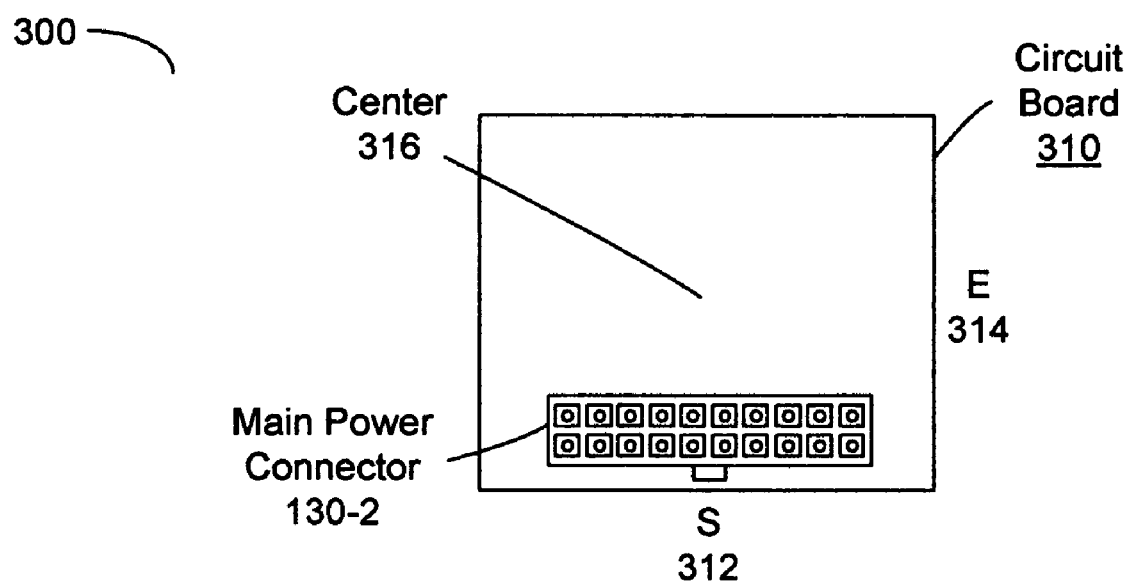
FIG. 3A is a block diagram illustrating an embodiment of a monolithic power supply.
Figure 3B:
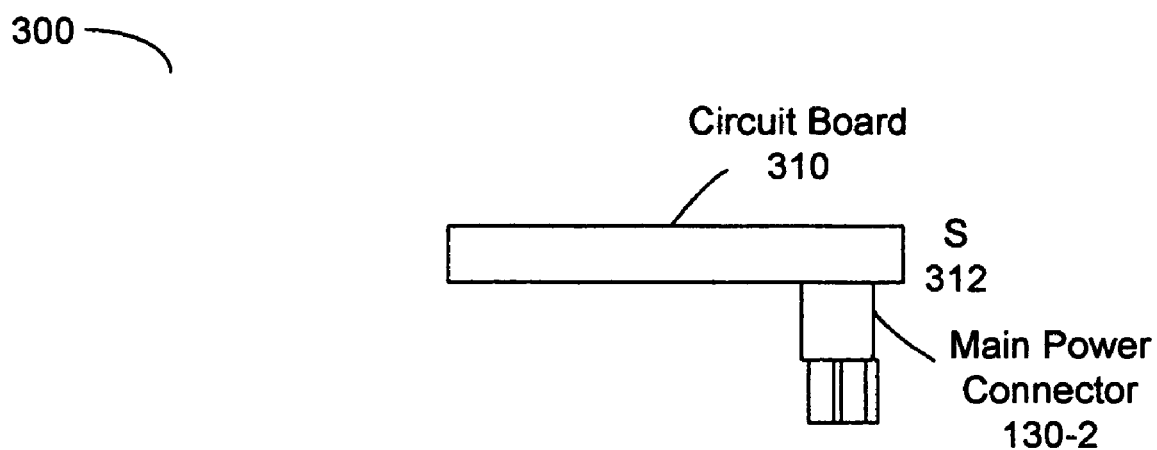
FIG. 3B is a block diagram illustrating an embodiment of a monolithic power supply.

FIGS. 3A and 3B are block diagrams illustrating a bottom view and a side view, respectively, of an embodiment of a monolithic power supply 300. The power supply 300 includes the main power connector 130-2 rigidly connected, including electrically and mechanically, to a circuit board 310 (such as a printed circuit board) thereby forming a monolithic assembly. In an exemplary embodiment, the main power connector 130-2 is an ATX connector and the rigid connection is provided, at least in part, by solder. The circuit board 310 includes one or more components (not shown), such as one or more integrated circuits, that implement the power conversion function of the power supply 300.

The contacts in the main power connector 130-2 are approximately perpendicular to a plane of the circuit board 310. In the power supply 300, the main power connector 130-2 is proximate to a south (S) 312 side of the circuit board 310. This configuration is referred to as a northern orientation.

In another embodiment, the main power connector 130-2 is proximate to an east (E) side 314 of the circuit board 310, in a configuration referred to as a western orientation. In another embodiment, the main power connector 130-2 is proximate to a center 316 of the circuit board 310

In some embodiments, the power supply 300 may include fewer components or additional components. For example, there may be one or more additional circuit boards. In some embodiments, two or more components in the power supply 300 may be combined or a position of at least one component may be changed.

Figure 4A:
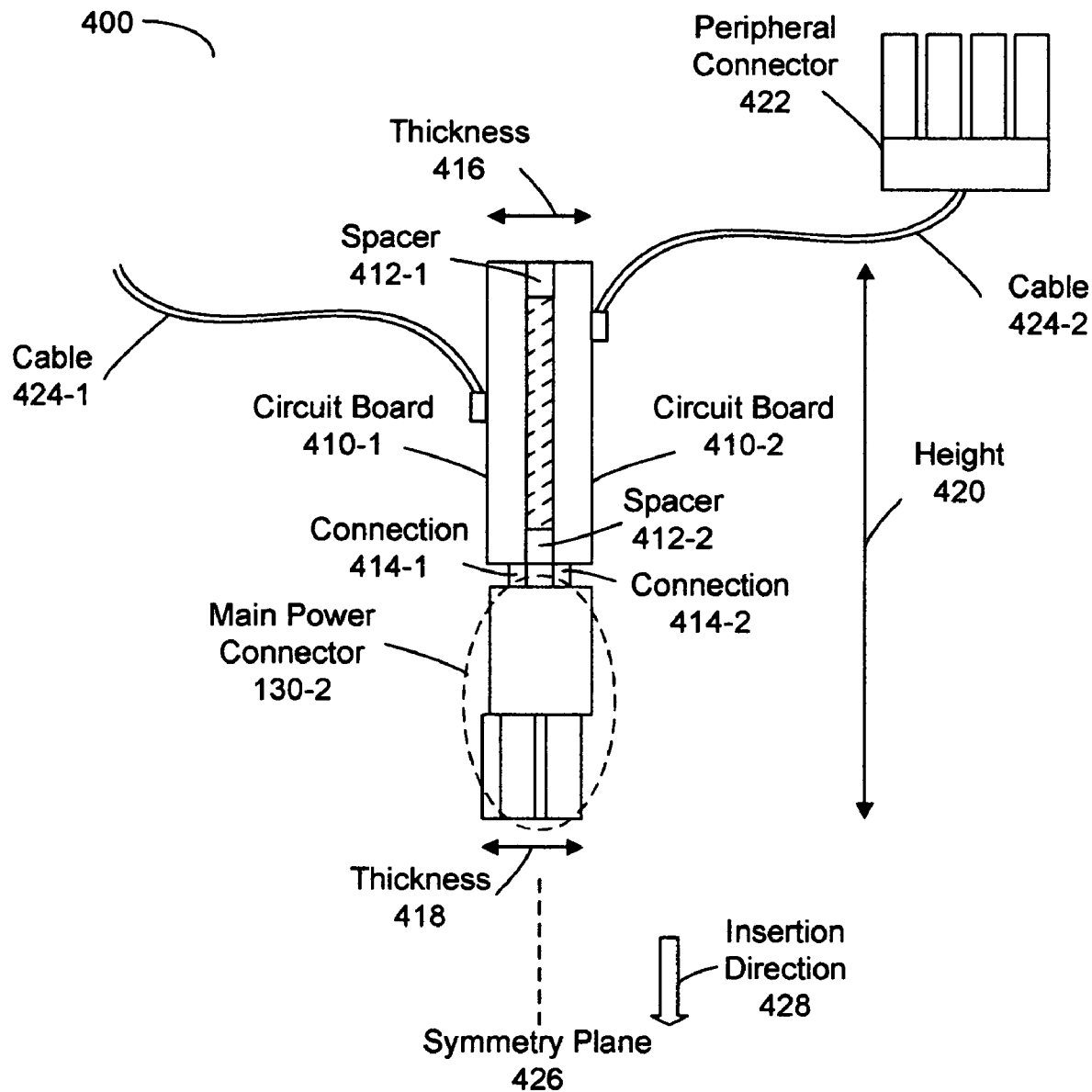
FIG. 4A is a block diagram illustrating an embodiment of a monolithic power supply.
Figure 4B:
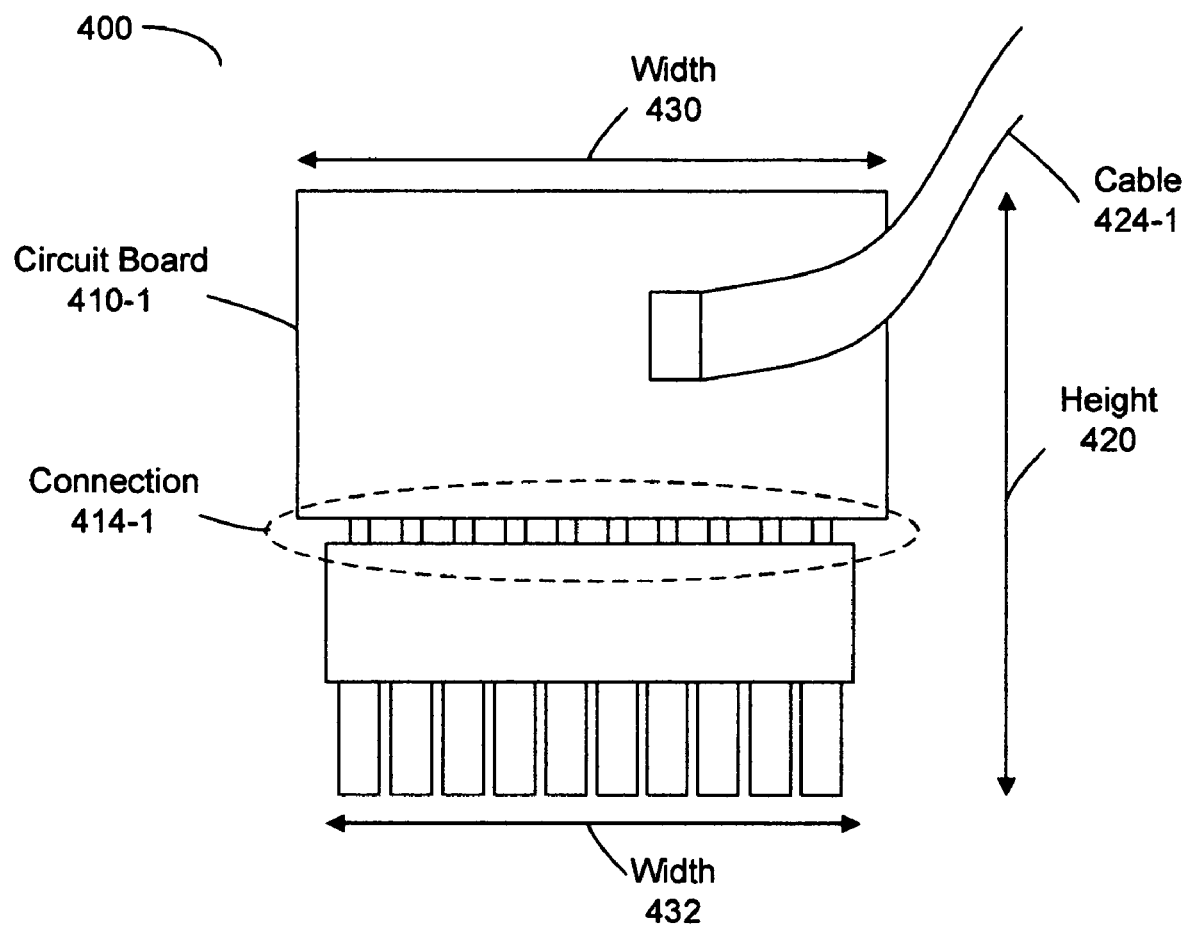
FIG. 4B is a block diagram illustrating an embodiment of a monolithic power supply.

FIGS. 4A and 4B are block diagrams illustrating side views of an embodiment of a monolithic power supply 400 that at least partially integrates a previously separate power supply. The power supply 400 offers compact size, reduced mechanical interference and simplicity, since the power supply 400 may be used with a wide variety of motherboard designs, i.e., a plurality of power supply configurations or models may not be needed. While exemplary embodiments utilize the power supply 400 and/or the power supply 300 (FIGS. 3A and 3B) in conjunction with a motherboard in a computer, it should be understood that either may be utilized in a variety of devices and applications, including small form-factor computers, embedded applications that have size and/or space constraints, and systems that may not include a cable harness.

The power supply 400 includes two circuit boards 410 (such as printed circuit boards) that are coupled to one another using spacers 412. The circuit boards 410 may be approximately parallel to each other. In some embodiments, the power supply 400 may include one circuit board or three or more circuit boards. The circuit boards 410 are each rigidly connected by connections 414 to the main power connector 130-2 thereby forming a monolithic assembly. Rigid connection includes mechanical and electrical connection. In other embodiments, the circuit boards 410 may be coupled to the main power connector 130-2 as opposed to being connected to it.

In an exemplary embodiment, the main power connector 130-2 is an ATX connector configured to couple power signals to a motherboard and the rigid connections 414 are provided, at least in part, by solder. Each of the circuit boards 410 may be electrically connected to a corresponding row of contacts in the main power connector 130-2. The main power connector 130-2 may include 4, 12, 20 or 24 electrical contacts.

The main power connector 130-2 may be configured to mate into the main power connector 130-1 (FIG. 1). Mating may be accomplished by inserting the main power connector 130-2 into the main power connector 130-1 (FIG. 1) approximately along a direction of insertion 428.

The circuit boards 410 may be approximately parallel to a symmetry plane 426 of a body of the main power connector 130-2. The symmetry plane 426 may be parallel to the direction of insertion 428. Thus, the power supply 400 may have the vertical orientation, as discussed further below with reference to FIG. 5. In some embodiments, the circuit boards 410 are approximately parallel to a symmetry plane of the power supply 400. In some embodiments, only one of the circuit boards 410 is approximately parallel to the symmetry plane 426 and/or the symmetry plane of the power supply 400.

Input electrical signals, for example, from an AC-to-DC power supply sub-module elsewhere in a computer, may be coupled to the power supply 400 via a cable 424-1. The cable 424-1 may be connected to one or both of the circuit boards 410. In some embodiments, the cable 424-1 is connected to one of the circuit boards 410, such as circuit board 410-1, and the input signals are then coupled to the other circuit board, such as circuit board 410-2. While the power supply 400 illustrates the cable 424-1 connected to the circuit board 410-1, in other embodiments the cable 424-1 may be connected to the circuit board 410-2.

The circuit boards 410 include one or more components (not shown), such as one or more integrated circuits, that implement the power conversion function of the power supply 400. The power supply 400 may include one or more power supply circuits. The one or more power supply circuits may include one or more DC-to-DC converter circuits. The one or more DC-to-DC converter circuits may include one or more switched power supplies. The one or more power supply circuits may include step-up and/or step-down power supplies. The one or more power supply circuits may include one or more linear regulators, one or more charge pumps, one or more bucking circuits, one or more boost circuits, one or more inverters, and/or one or more push-pull configurations.

The output electrical signals from the one or more power supply circuits may include a pre-determined set of DC voltages. The output electrical signals may include approximately regulated voltages. In some embodiments, the output electrical signals may be selected from a pre-determined set of DC voltages. In some embodiments, the output electrical signals may be adapted, adjusted and/or configured. The adapting, adjusting and/or configuring may be dynamic.

In an exemplary embodiment, the input electrical signals are approximately between 5 and 48 V. The output electrical signals may include approximately regulated voltages of 3.3V, 5V, 5VSB, −5V, −12V and/or 12V. These output electrical signals may be generated using one or more electrical circuits on at least one of the circuit boards 410.

One or more of the output electrical signals may be coupled to one or more additional peripheral devices, such as floppy disk drives or hard drives, using a cable 424-2 and a peripheral connector 422. While the power supply 400 illustrates the cable 424-2 connected to the circuit board 410-2, in other embodiments the cable 424-2 may be connected to the circuit board 410-1.

The power supply 400 may have a thickness 416 (including the circuit boards 410 and the spacer 412) and a height 420. The thickness 416 may be larger than a thickness 418 of the main power connector 130-2. In some embodiments, the height 420 is approximately 10, 20 60 or 120 mm. In some embodiments, the height 420 is approximately between 10 and 120 mm. In some embodiments, the thickness 416 is approximately between 5 and 100 nm. The thickness 416 may be approximately 5, 10, 20 or 40 mm greater than the thickness 418. In some embodiments, the thickness 416 minus the thickness 418 is less than approximately 40 mm.

FIG. 4B illustrates a width 430 of the power supply 400. The width 430 may be larger than a width 432 of the main power connector 130-2. In some embodiments, the width 430 is approximately less than 120 mm. The width 430 may be approximately 5, 10, 20 or 40 mm greater than the width 432. In some embodiments, the width 430 minus the width 432 is less than approximately 40 mm.

In some embodiments, the power supply 400 may include fewer components or additional components. For example, there may be one or more additional circuit boards 410. In some embodiments, two or more components in the power supply 400 may be combined or a position of at least one component may be changed.

Figure 5:
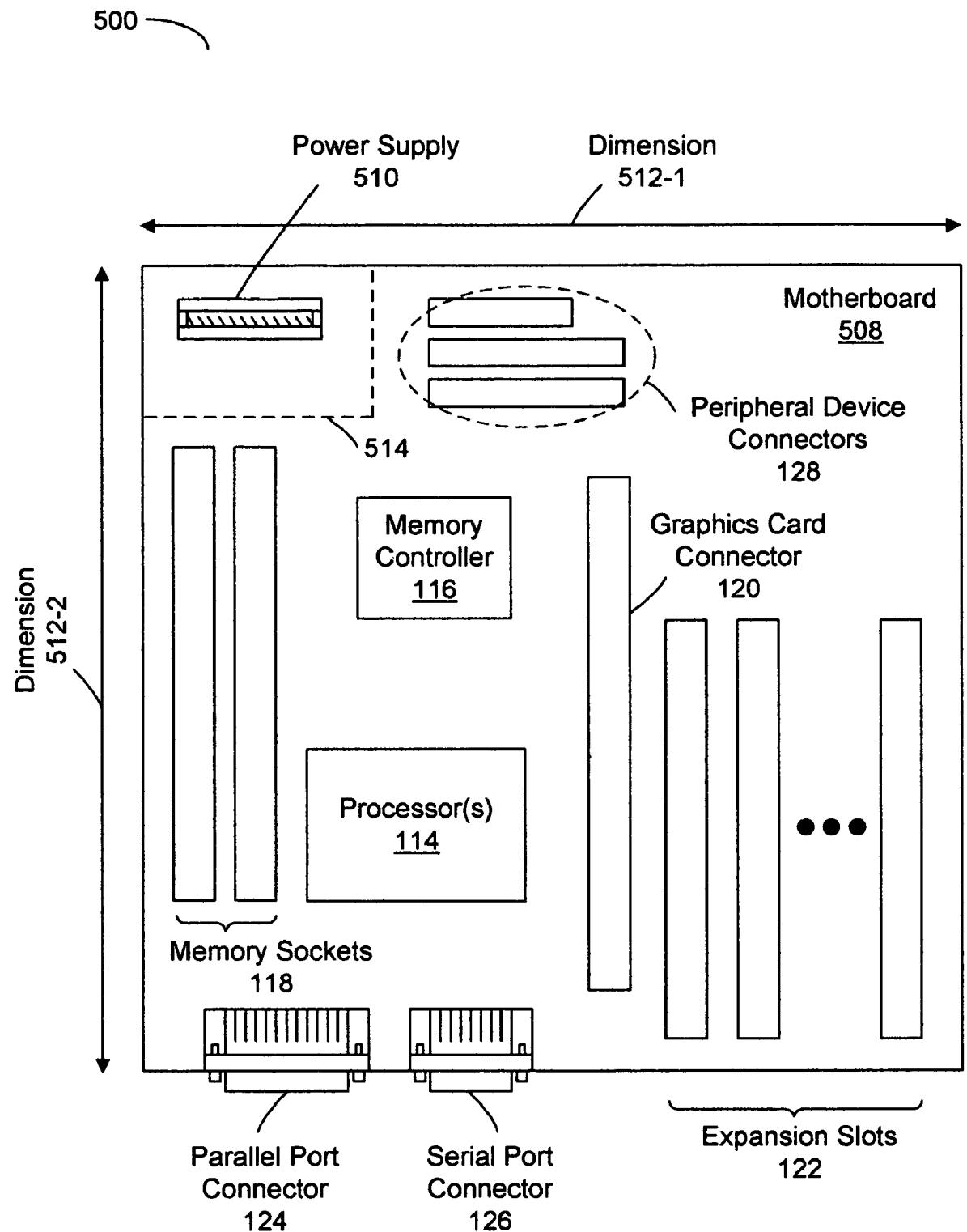
FIG. 5 is a block diagram illustrating an embodiment of a system.

FIG. 5 is a block diagram illustrating an embodiment of a system 500. A motherboard 508 is connected to a power supply 510, such as the power supply 400 (FIGS. 4A and 4B). In some embodiments, the power supply 510 is removably connected to the motherboard 508. The power supply 510 has the vertical orientation. The power supply 510 may provide power to the motherboard 508. The compact size and, thus, the reduced mechanical interference associated with the power supply 510 may allow a deforested region 514 to be reduced in size relative to the region 132 (FIG. 1). As a consequence, dimensions 512 of the motherboard 508 may also be reduced relative to the dimensions 112 (FIG. 1). The power supply 510 may also allow expensive and cumbersome components, such as the cable harness 210 (FIG. 2), to be simplified or eliminated.

In some embodiments, the system 500 may include fewer components or additional components. For example, there may be one or more additional circuit boards. In some embodiments, two or more components in the system 500 may be combined or a position of at least one component may be changed.

Monolithic power supplies, such as the power supply 400 (FIGS. 4A and 4B) may offer reduce or eliminate other challenges associated with existing power supplies. For example, the cable harness 210 (FIG. 2) offers limited heat conduction. As a consequence, the cable harness 210 (FIG. 2) offers limited dissipation of heat generated in a separate power supply. In contrast, more of the heat generated in the power supply 510 may be dissipated into the motherboard 508, i.e., the motherboard 508 may function, at least in part, as a heat sink for the power supply 510. As illustrated in FIG. 4A, this is a consequence of a limited height of the main power connector 130-2 (for example, some 10 mm) relative to a length of the cable harness 210 (FIG. 2) (for example, some 100-400 mm). Thus, the power supply 510 may be able to dissipate more power and still have a maximum temperature that is less than or comparable to existing power supplies.

Figure 6:
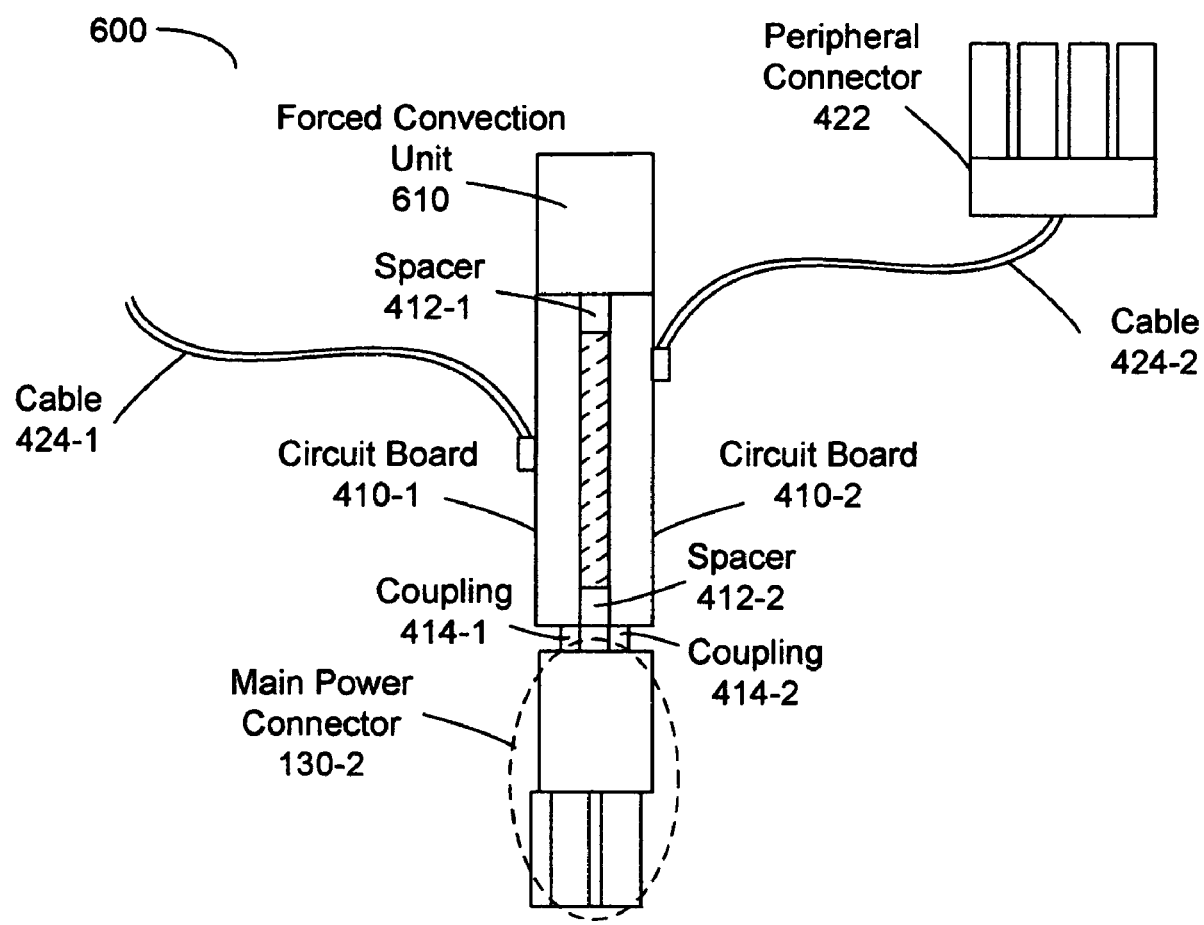
FIG. 6 is a block diagram illustrating an embodiment of a monolithic power supply.

In some embodiments, a monolithic power supply, such as the power supply 300 (FIGS. 3A and 3B) and/or the power supply 400 (FIGS. 4A and 4B), may include active cooling components, such as one or more fans and/or devices based on the Peltier effect. This is illustrated in FIG. 6, which is a block diagram illustrating an embodiment of a monolithic power supply 600. In the power supply 600, a forced convection unit 610, such as a fan, blows air between the circuit boards 410.

In some embodiments, the power supply 600 may include fewer components or additional components. For example, a forced convection unit may be included on one or both of the circuit boards 410. In some embodiments, two or more components in the power supply 600 may be combined or a position of at least one component may be changed.

Monolithic power supplies that have two or more circuit boards, such as the power supply 400 (FIGS. 4A and 4B), may also generate and/or radiate less electromagnetic interference. The two or more circuit boards, such as the circuit boards 410 (FIGS. 4A and 4B), may act like ground planes for one another. The electromagnetic interference generated and/or radiated by such power supplies may, therefore be reduced without using a metal enclosure.

Figure 7:
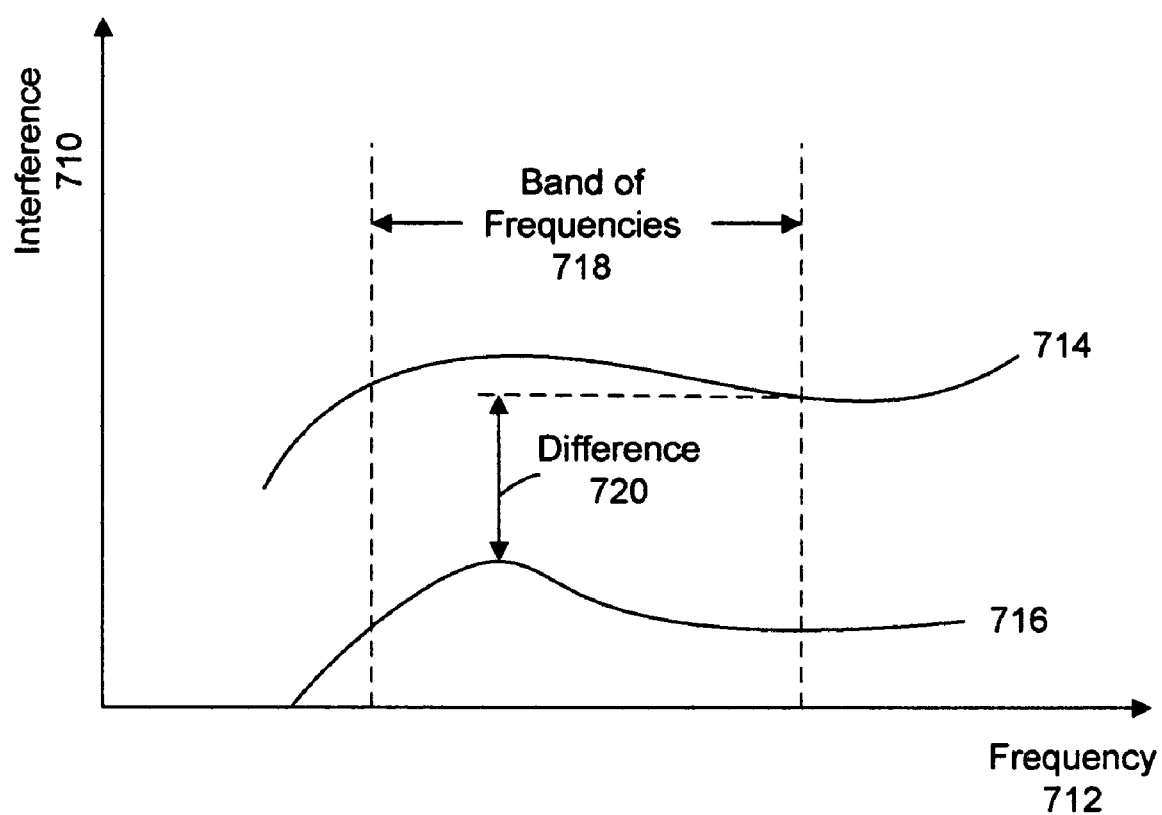
FIG. 7 is a schematic of electromagnetic interference as a function of frequency for two power supplies.

This reduction is illustrated in FIG. 7, which is a schematic of electromagnetic interference 710 as a function of frequency 712 for two power supplies, 714 and 716. The power supply 714 has one circuit board and the power supply 716 has two circuit boards. The power supply 716 has less electromagnetic interference 710 in a band of frequencies 718. In an exemplary embodiment, the band of frequencies 718 approximately is between 0 and 30 MHz.

FIG. 7 also illustrates a magnitude of a difference 720 in the electromagnetic interference 710 in the band of frequencies 718. In some embodiments, the difference 720 may correspond to a 10, 25 or 50% reduction in the electromagnetic interference 710. In some embodiments, the difference 720 may be more than 1 or 3 dB.

Figure 8:
FIG. 8 is a flow chart illustrating a process of using a monolithic power supply.

Attention is now directed towards a method of using a monolithic power supply. FIG. 8 is a flow chart illustrating a process 800 of using a monolithic power supply. A power supply is vertically mounted into a corresponding connector (810). Respective voltages for one or more output electrical signals are optionally selected from a set of pre-determined voltages (820). In some embodiments, there may be additional or fewer operations. An order of the operations may be changed. Two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A power supply to provide power to a motherboard, comprising:
a main power connector having a body that includes a plurality of contacts, wherein the main power connector is configured to mate with an another corresponding main power connector on the motherboard in a computer, wherein the other corresponding main power connector is other than an expansion card slot, and wherein the motherboard is coupled to one or more processors; and
one or more circuit boards rigidly connected to the main power connector, wherein a first plane including a first circuit board in the one or more circuit boards is substantially parallel to a symmetry plane of the body, rigidly connected includes mechanical connection and electrical connection, the symmetry plane including a direction of insertion of the main power connector when mated with the other corresponding main power connector, wherein the one or more circuit boards include one or more switched mode power supplies to convert an input signal to one or more output signals, and wherein the one or more output signals include voltages in at least a subset of a pre-determined set of voltages.

2. The power supply of claim 1, further comprising an interconnect coupled to at least one of the one or more circuit boards, wherein the interconnect includes a plurality or wires coupled to one or more additional connectors, and wherein the interconnect is configured to couple the power supply to one or more peripheral devices.

3. The power supply of claim 1, wherein the main power connector is an ATX connector.

4. The power supply of claim 1, wherein each of the one or more switched mode power supplies comprises a DC-to-DC converter.

5. The power supply of claim 1, wherein the one or more circuit boards include the first circuit board and a second circuit board.

6. The power supply of claim 1, wherein the one or more output signals are each substantially regulated voltages.

7. The power supply of claim 1, wherein the input signal has a voltage approximately between 5 and 48 V.

8. The power supply of claim 1, wherein the one or more output signals include 3.3 V, 5 V, 5VSB, 12 V, −12 V and −5 V.

9. The power supply of claim 1, wherein the power supply has a height less than a pre-determined value.

10. The power supply of claim 1, wherein a number of contacts in the plurality of contacts is selected from a group consisting of 12, 20 and 24.

11. The power supply of claim 1, wherein the power supply has a width less than a pre-determined value.

12. The power supply of claim 5, wherein the plurality of contacts include a first set of contacts arranged in a first row and a second set of contacts arranged in a second row, the first row is substantially parallel to the second row, and wherein the first circuit board is rigidly connected to the first set of contacts and the second circuit board is rigidly connected to the second set of contacts.

13. The power supply of claim 5, wherein a second plane including the second circuit board is substantially parallel to the first plane.

14. The power supply of claim 5, wherein the power supply generates at least 3 dB less electromagnetic interference in a band of frequencies than a power supply that has one circuit board.

15. The power supply of claim 9, wherein the pre-determined value is approximately between 10 and 120 mm.

16. The power supply of claim 11, wherein the width is less than 120 mm.

17. The power supply of claim 14, wherein the band of frequencies is approximately between 0 and 30 MHz.

18. A power supply to provide power to a motherboard, comprising:
   a main power connector having a body that includes a plurality of contacts, wherein the main power connector is configured to mate with an other corresponding main power connector on the motherboard in a computer, wherein the other corresponding main power connector is other than an expansion card slot, and wherein the motherboard is coupled to one or more processors; and
   one or more circuit boards rigidly connected to the main power connector, wherein a first plane including a first circuit board in the one or more circuit boards is substantially parallel to a symmetry plane of the body of the main power connector, rigidly connected includes mechanical connection and electrical connection, the symmetry plane including a direction of insertion of the main power connector when mated with the other corresponding main power connector, and wherein the one or more circuit boards include one or more regulation means for converting an input signal to one or more output signals, and wherein the one or more output signals include voltages in at least a subset of a pre-determined set of voltages.

19. A system, comprising:
   a motherboard in a computer, wherein the motherboard is coupled to one or more processors and includes a first main power connector which is other than an expansion card slot; and
   a power supply to provide power to the motherboard, including:
      a second main power connector having a body that includes a plurality of contacts, wherein the second main power connector is mated to the first main power connector; and
      one or more circuit boards rigidly connected to the second main power connector, wherein a first plane including a first circuit board in the one or more circuit boards is substantially parallel to a symmetry plane of the body, rigidly connected includes mechanical connection and electrical connection, the symmetry plane including a direction of insertion of the second main power connector when mated with the first main power connector, and wherein the one or more circuit boards include one or more switched mode power supplies to convert an input signal to one or more output signals, the one or more output signals providing power to the motherboard, and wherein the one or more output signals include voltages in at least a subset of a pre-determined set of voltages.

* * * * *